United States Patent
DeBoer

(12) 
(10) Patent No.: US 6,471,811 B1
(45) Date of Patent: Oct. 29, 2002

(54) INK COLOR PROOFING

(75) Inventor: Charles D. DeBoer, Palmyra, NY (US)

(73) Assignee: Eastman Kodak Company, Rochester, NY (US)

( * ) Notice: Subject to any disclaimer, the term of this patent is extended or adjusted under 35 U.S.C. 154(b) by 106 days.

(21) Appl. No.: 09/671,721

(22) Filed: Sep. 27, 2000

(51) Int. Cl.$^7$ ............................................. B41M 5/00
(52) U.S. Cl. ................................ 156/235; 428/195
(58) Field of Search ............................. 428/195, 913, 428/914; 156/235

(56) References Cited

U.S. PATENT DOCUMENTS

| | | | |
|---|---|---|---|
| 4,600,669 A | 7/1986 | Ng et al. .................... | 430/47 |
| 5,023,229 A | 6/1991 | Evans et al. ................ | 503/227 |
| 5,024,990 A | 6/1991 | Chapman et al. ........... | 503/227 |
| 5,134,116 A | 7/1992 | Chapman et al. ........... | 503/227 |
| 5,589,269 A | * 12/1996 | Ali ............................ | 428/411.1 |
| 6,001,463 A | * 12/1999 | Shibahara et al. .......... | 428/216 |
| 6,291,127 B1 | * 9/2001 | Dagan et al. ............... | 430/201 |

OTHER PUBLICATIONS

"Color Measurement of Inks for Web Offset Proving", Proceedings of the 19th International Conference of Printing Research Institutes, Eisenstadt, Austria, Jun. 1987, J. T. Ling and R. Warner, p. 55.

Specifications Web Offset Publications (SWOP), Eighth edition, 1997.

* cited by examiner

Primary Examiner—Bruce H. Hess
(74) Attorney, Agent, or Firm—Raymond L. Owens

(57) ABSTRACT

A method of forming color proof images of inks on a printing stock prior to a production or press run, comprising the steps of providing a receiver having a peelable substrate, such receiver including a layer having a mordant in a binder formed over the substrate which will form a bond with colorant in the ink and an ink-receiving layer formed over the mordant layer which is permeable to ink, but which restricts spreading of ink as it passes through such layer to the mordant layer; depositing ink having colorants onto the ink-receiving layer to form a color proof image in the mordant layer; and laminating the receiver to a printing stock and removing the peelable substrate from the receiver to form the color proof.

9 Claims, 2 Drawing Sheets

INK COLOR PROOFING

FIELD OF THE INVENTION

The present invention relates to providing color proof images of inks on a printing stock prior to a production or press run.

BACKGROUND OF THE INVENTION

In order to approximate the appearance of continuous-tone (photographic) images via ink-on-paper printing; the commercial printing industry relies on a process known as halftone printing. In halftone printing, color density gradations are produced by printing patterns of dots of various sizes, but of the same color density, instead of varying the color density uniformly as is done in photographic printing. There is an important commercial need to obtain a color proof image before a printing press run is made. It is desired that the color proof will accurately represent the image quality, details, and color tone scale and, in many cases, the halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, fall-color picture is assembled. U.S. Pat. No. 4,600,669 to Ng et al., for example, discloses an electrophotographic color proofing system.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology", Proceedings of the 19th International Conference of Printing Research Institutes, Eisenstadt, Austria, Jun. 1987, J. T. Ling and R. Warner, p. 55. Preferred dyes and dye combinations found to best match the SWOP Color References are the subject matter of commonly assigned U.S. Pat. No. 5,024,990 to Chapman and Evans, 5,023,229 to Evans and Chapman, and 5,134,116 to Chapman and Evans, the disclosures of which are incorporated by reference.

In the past, images for the printing industry were prepared on black and white films, with each color record on a different film. A proof of the complete image could be prepared from these films by a variety of photosensitive systems, by contacting the film with the colored photosensitive material, exposing the assembly to bright light, and then developing the photosensitive material to remove the non-imaged areas, and finally assembling the four colored images into the complete image. During the past few years, the printing industry has shown a willingness to embrace digital images which can be imaged, pixel by pixel, directly onto printing plates, without the intervention of film. In this case, accurate digital color proofs are essential to predict the results of the press run without the expense of making a proof on the press.

There remains a commercial need for an accurate, low cost method for preparing a color proof of a digital image in the graphic arts industry.

SUMMARY OF THE INVENTION

It is therefore an object of the present invention to prepare low cost accurate color proofs of digital images using ink jet printing with a special receiver that can be laminated to the final printing press stock paper.

This object is achieved by a method of forming color proof images of inks on a printing stock prior to a production or press run, comprising the steps of:

a) providing a receiver having a peelable substrate, such receiver including a layer having a mordant in a binder formed over the substrate which will form a bond with colorant in the ink and an ink-receiving layer formed over the mordant layer which is permeable to ink, but which restricts spreading of ink as it passes through such layer to the mordant layer;

b) depositing ink having colorants onto the ink-receiving layer to form a color proof image in the mordant layer; and c) laminating the ink-receiving layer to the printing stock and removing the peelable substrate from the receiver to form a color proof.

This object is also achieved by providing a receiver having a peelable substrate with a layer having a mordant in a binder over the substrate which will mordant the ink image, and an ink-receiving layer over the mordant layer which is permeable to ink, but which restricts spreading of ink as it passes through the ink-receiving layer to the mordant layer. The image is deposited onto the ink-receiving layer to form a color proof in the mordant layer and laminated to a printing stock paper after which the peelable substrate is removed to form a color proof.

ADVANTAGES

Color proofs made in accordance with the present invention can use ink jet printing techniques, which are economically advantageous.

The proofs are made on the same paper as the press run, providing an accurate rendition of the color hues and densities.

The present invention permits a press operator to adjust the press conditions to provide printed impressions of the colored hues and densities desired by the customer.

DETAILED DESCRIPTION OF THE INVENTION

Figure 1:
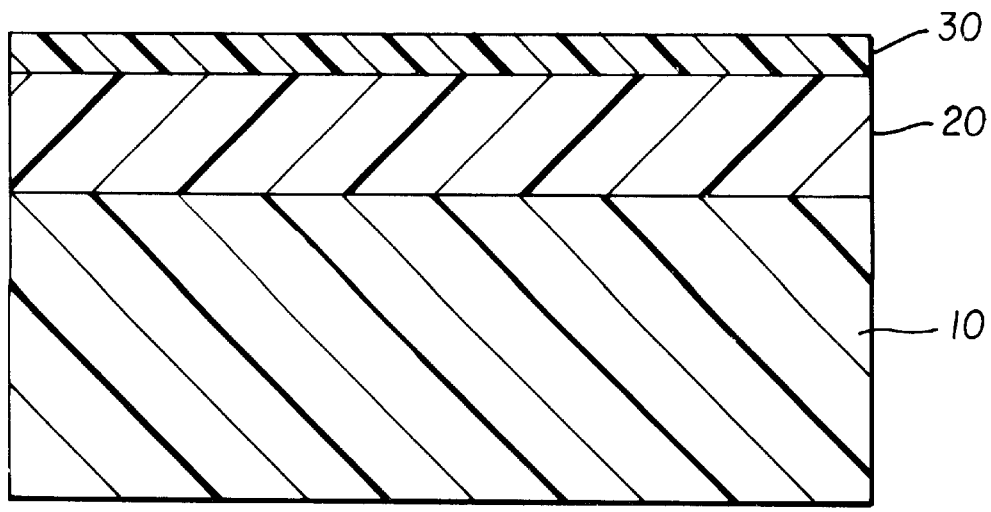
FIG. 1 shows a side view of the receiver layer, showing the peelable substrate, the mordant layer, and the ink-receiving layer.

Turning now to FIG. 1, the peelable substrate 10 is shown, overcoated with a mordant layer 20 having a mordant in a binder, and this overcoated with an ink-receiving layer 30.

The peelable substrate 10 for the element can be any flexible material that is conventionally used in imaging elements. Examples of such materials include, but are not limited to, polymeric films such as those formed from addition polymers or linear condensation polymers, transparent foams and fabrics. A preferred support material is a polyester film, such as a polyethylene terephthalate film. Flexible metal or paper sheets, or laminates of any of these and polymeric films can also be used as the support. The thickness of the support can be varied, as long as it is sufficient to handle without thinking, but thin enough to be economic and to pass through a laminator. A preferred support material is a polyethyleneterephthalate film having a thickness from about 100 to about 200 $\mu$. The support should resist stretching so the color records will register in a full color image. The support may be coated with one or more "subbing" layers to control adhesion of the final assemblage, so that the image peels effectively after lamination to the printing press stock paper 50, but does not peel prematurely before lamination. The backside of the support may be coated with antistat agents and/or slipping layers or matte layers to improve handling and "feel" of the element.

The mordant layer 20 includes a mordant having a strong affinity for the image colorants. In a preferred embodiment of the invention, the image colorants are water-soluble anionic ink jet dyes. In this embodiment the preferred mordant is a polymeric quaternary ammonium salt. One preferred such polymer is poly(1-vinylpyrrolidone-co-2-dimethylaminoethylmethacrylate), quaternized with diethyl sulfate, in an amount from 5% to 50% of the mordant layer 20. The remainder of the mordant layer 20 is a water-soluble binder such as polyvinylacetate, hydrolyzed from 75 to 99% to the polyvinylalcohol. Other quaternized amine containing polymers may also be used as the mordant, and other polymers may be used as the binder. There may also be included other materials, such as surfactants, rheology modifiers, thermal polymerization inhibitors, tackifiers, plasticizers, colorants, antioxidants, or fillers. The mordant layer 20 is coated by any of the common coating methods, including spin coating, knife coating, gravure coating, dip coating, or extrusion hopper coating. Solvents, coating and drying conditions are chosen based on the nature of the materials used in the layers, as is well known to those skilled in the art of receiver coating manufacture. The thickness of the mordant layer 20 is from 1 to 100 microns, and preferably from 10 to 30 microns.

Figure 2:
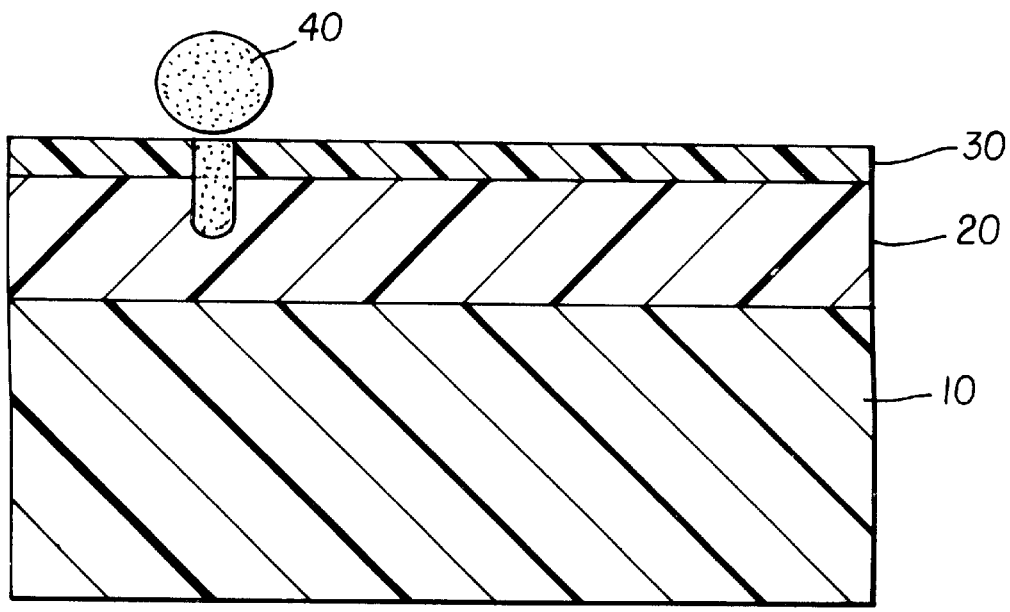
FIG. 2 shows the layer of FIG. 1 after a droplet of colorant has been deposited onto the surface of the ink-receiving layer, so that the droplet does not spread, but penetrates directly into the mordant layer below.

The ink-receiving layer 30 is a layer of material that has a high contact angle with a droplet of ink. As shown in FIG. 2, the colorant droplet 40 has a contact angle greater than 15 degrees, and preferably, greater than 30 degrees with the surface of the ink-receiving layer 30. This steep contact angle insures that the droplet will undergo minimal spreading as it is absorbed into the mordant layer 20. The ink-receiving layer is preferably bound by lamination under heat, pressure, or both to the press stock paper 50. Alternatively, an adhesive material can be included in the ink-receiving layer 30 or a separate adhesive layer can be provided prior to lamination.

In a preferred embodiment of the invention, the ink-receiving layer 30 is a layer of poly(1-vinylpyrrolidone-co-styrene). The ink-receiving layer 30 is preferably coated from a solvent that does not dissolve the mordant layer 20, so intermixing of the layers is minimized. In a preferred embodiment of the invention the solvent for the ink-receiving layer is propanol. The ink-receiving layer 30 may be coated by any of the common coating methods mentioned above for the mordant layer 20. The thickness of the ink-receiving layer is from 0.1 to 5 microns, and preferably from 0.5 to 2 microns.

Figure 3:
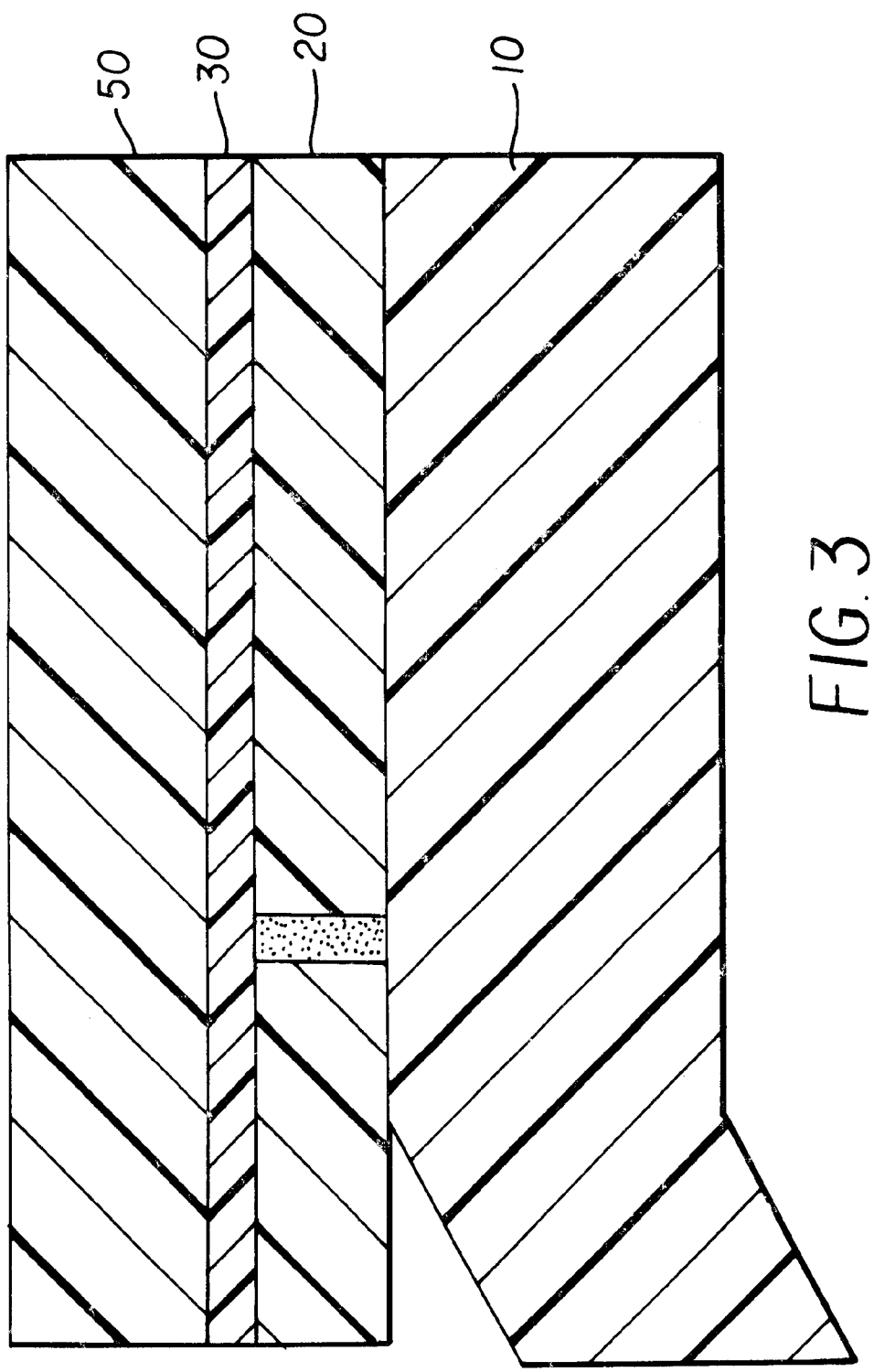
FIG. 3 shows the image laminated to a press stock paper, and the peelable substrate being removed.

FIG. 3 shows a diagram of the use of the invention. After the image has been deposited on the ink-receiving layer 30, preferably by ink jet printing, the image surface is placed in contact with a sheet of printing press stock paper 50. The assembly (receiver and lamination layer) is then passed through a laminator, where heat and/or pressure fuse the image layers to the press stock paper 50. Various ink jet printers can be used in accordance with the present invention such as drop-on demand and a continuous ink jet printer. Press stock papers include not only open weave, or uncoated papers, but also papers that are commonly coated with mixtures of clay and starch. The paper coating may also include whiteners and optical brighteners, as is well known to those skilled in the art of paper making. Because of the variety of papers manufactured and sold to the printing industry, it is important that the ink-receiving layer 30 be able to form a strong bond to the surface of most or all of the important press stock papers commonly used in the industry. After passing through the laminator with the press stock paper 50, the peelable substrate 10 is peeled from the mordant layer 20, leaving the image laminated to the printing press stock paper 50 to provide a color proof. The background color of the image is now identical to that of the impressions printed on the printing press, so the details of the image hues and densities can be accurately evaluated.

To make an accurate color proof, it is not only necessary to have the background color the same as the final press impressions, but also to have the hues and densities of the image colors the same as the press inks. The hues and densities of ink jet inks depend not only on the colorants selected to prepare the inks, but also on the composition of the mordant and polymeric binder used in the mordant layer 20. In practice, both the colorants and the mordant polymer are chosen based on the nature of the materials used in the layers, as is well known to those skilled in the art of color ink jet printing manufacture.

The invention has been described in detail with particular reference to certain preferred embodiments thereof, but it will be understood that variations and modifications can be effected within the spirit and scope of the invention.

PARTS LIST 10 peelable substrate
20 mordant layer
30 ink-receiving layer
40 colorant droplet
50 press stock paper

What is claimed is:

1. A method of forming color proof images of inks on a printing stock prior to a production or press run, comprising the steps of:
    a) providing a receiver having a peelable substrate, such receiver including a layer having a mordant in a binder formed over the substrate which will form a bond with colorant in the ink and an ink-receiving layer formed over the mordant layer which is permeable to ink, but which restricts spreading of ink as it passes through such layer to the mordant layer;
    b) depositing ink having colorants onto the ink-receiving layer to form a color proof image in the mordant layer; and
    c) laminating the ink-receiving layer to the printing stock and removing the peelable substrate from the receiver to form a color proof.

2. The method of claim 1 wherein the laminating step includes using heat or pressure or both to laminate the printing stock to the ink-receiving layer.

3. The method of claim 1 wherein the ink-receiving layer is a layer of material that has a high contact angle with a droplet of ink.

4. The method of claim 1 wherein the ink includes a colorant having a water soluble anionic dye.

5. The method of claim 4 wherein the mordant is a polymeric quaternary ammonium salt.

6. A receiver for use in transferring a color proof image to receiving stock, comprising:
   a) a peelable substrate;
   b) a layer having a mordant in a binder formed over the substrate which will form a bond with colorant in the ink and an ink-receiving layer; and
   c) an ink-receiving layer which is permeable to ink, but which restricts spreading of ink as it passes through such layer to the mordant layer whereby the ink-receiving layer is adapted to be laminated to the printing stock and thereafter the peelable substrate is removed to form a color proof.

7. The receiver of claim 6 wherein the ink-receiving layer is a layer of material that has a high contact angle with a droplet of ink.

8. The receiver of claim 6 wherein the ink includes a colorant having a water soluble anionic dye.

9. The receiver of claim 8 wherein the mordant is a polymeric quaternary ammonium salt.

* * * * *